(12) United States Patent
Cheng et al.

(10) Patent No.: US 11,342,230 B2
(45) Date of Patent: May 24, 2022

(54) HOMOGENEOUS DENSIFICATION OF FILL LAYERS FOR CONTROLLED REVEAL OF VERTICAL FINS

(71) Applicant: TESSERA, INC., San Jose, CA (US)

(72) Inventors: Kangguo Cheng, Schenectady, NY (US); Choonghyun Lee, Rensselaer, NY (US); Juntao Li, Albany, NY (US); Heng Wu, Guilderland, NY (US); Peng Xu, Santa Clara, CA (US)

(73) Assignee: Tessera, Inc., San Jose, CA (US)

( * ) Notice: Subject to any disclaimer, the term of this patent is extended or adjusted under 35 U.S.C. 154(b) by 0 days.

(21) Appl. No.: 16/505,063

(22) Filed: Jul. 8, 2019

(65) Prior Publication Data

US 2019/0333824 A1 Oct. 31, 2019

Related U.S. Application Data

(62) Division of application No. 15/824,537, filed on Nov. 28, 2017, now Pat. No. 10,410,928.

(51) Int. Cl.
*H01L 21/8234* (2006.01)
*H01L 21/311* (2006.01)
(Continued)

(52) U.S. Cl.
CPC .............. *H01L 21/823481* (2013.01); *H01L 21/02323* (2013.01); *H01L 21/02337* (2013.01); *H01L 21/31111* (2013.01); *H01L 21/31122* (2013.01); *H01L 21/31133* (2013.01); *H01L 21/76224* (2013.01); *H01L 21/76237* (2013.01); *H01L 21/823431* (2013.01); *H01L 27/0886* (2013.01); *H01L 29/0653* (2013.01);
(Continued)

(58) Field of Classification Search
None
See application file for complete search history.

(56) References Cited

U.S. PATENT DOCUMENTS 5,278,103 A * 1/1994 Mallon ............. H01L 21/31051
257/E21.243
6,103,625 A * 8/2000 Marcyk ............... H01L 21/3212
257/E21.304
(Continued)

OTHER PUBLICATIONS

Li et al., "Yttrium passivation of defects in GeO2 and GeO2/Ge interfaces", Appl. Phys. Lett. 110, 032903 (2017); https://doi.org/10.1063/1.4974291, Jan. 19, 2017 (Year: 2017).*
(Continued)

*Primary Examiner* — Vincent Wall
(74) *Attorney, Agent, or Firm* — Lee & Hayes, P.C.

(57) ABSTRACT

In accordance with an embodiment of the present invention, a method of forming a densified fill layer is provided. The method includes forming a pair of adjacent vertical fins on a substrate, forming an inner liner on the sidewalls of the adjacent vertical fins, and forming a sacrificial layer on the inner liner. The method further includes forming a fill layer between the pair of adjacent vertical fins, wherein the fill layer is in contact with at least a portion of the sacrificial layer, removing at least a portion of the sacrificial layer in contact with the fill layer to form sidewall channels adjacent to the fill layer, and subjecting the fill layer to a densification process to form the densified fill layer.

19 Claims, 10 Drawing Sheets

(51) Int. Cl.
*H01L 27/088* (2006.01)
*H01L 29/06* (2006.01)
*H01L 21/762* (2006.01)
*H01L 29/78* (2006.01)
*H01L 29/66* (2006.01)
*H01L 21/02* (2006.01)
*H01L 21/3115* (2006.01)

(52) U.S. Cl.
CPC .... *H01L 29/66795* (2013.01); *H01L 29/7851* (2013.01); *H01L 21/31155* (2013.01); *H01L 21/823412* (2013.01); *H01L 21/823456* (2013.01)

(56) References Cited

U.S. PATENT DOCUMENTS

| | | | |
|---|---|---|---|
| 6,368,924 B1* | 4/2002 | Mancini | G03F 7/09 |
| | | | 438/286 |
| 7,015,113 B2* | 3/2006 | Derderian | H01L 21/76224 |
| | | | 257/E21.546 |
| 7,510,981 B2* | 3/2009 | Mitsuiki | H01L 21/76224 |
| | | | 257/E21.545 |
| 8,557,649 B2* | 10/2013 | Venigalla | H01L 21/3081 |
| | | | 257/E21.632 |
| 8,557,712 B1 | 10/2013 | Antonelli et al. | |
| 9,257,302 B1 | 2/2016 | Wang et al. | |
| 9,281,378 B2 | 3/2016 | Ching et al. | |
| 9,385,233 B2 | 7/2016 | Akarvardar et al. | |
| 9,653,359 B2 | 5/2017 | Cheng et al. | |
| 9,691,765 B1 | 6/2017 | Bi et al. | |
| 9,722,026 B2 | 8/2017 | Toriumi et al. | |
| 10,515,845 B2* | 12/2019 | Lo | H01L 21/266 |
| 2001/0000242 A1* | 4/2001 | Huang | H01L 27/10852 |
| | | | 438/106 |
| 2001/0016411 A1* | 8/2001 | Petrarca | H01L 21/764 |
| | | | 438/622 |
| 2002/0048959 A1* | 4/2002 | Clevenger | H01L 21/28525 |
| | | | 438/692 |
| 2009/0020845 A1* | 1/2009 | Shin | H01L 21/3105 |
| | | | 257/506 |
| 2011/0017997 A1* | 1/2011 | Kamath | H01L 27/1218 |
| | | | 257/66 |
| 2014/0252497 A1 | 9/2014 | Peng et al. | |
| 2014/0306317 A1 | 10/2014 | Licausi | |
| 2014/0353795 A1* | 12/2014 | Tong | H01L 21/76224 |
| | | | 257/506 |
| 2015/0243739 A1* | 8/2015 | Chen | H01L 21/845 |
| | | | 257/623 |
| 2016/0013313 A1* | 1/2016 | Cheng | H01L 29/267 |
| | | | 257/408 |
| 2016/0233088 A1* | 8/2016 | Feng | H01L 21/2256 |
| 2016/0247876 A1* | 8/2016 | Chung | H01L 29/0649 |
| 2017/0053835 A1 | 2/2017 | Sung et al. | |
| 2019/0157159 A1* | 5/2019 | Wen | H01L 21/76229 |

OTHER PUBLICATIONS

List of IBM Patents or Patent Applications Treated as Related dated Jul. 8, 2019, 2 pages.

Du et al., "Optimization of STI Oxide Recess Uniformity for FinFET Beyond 20nm," 2015 China Semiconductor Technology International Conference. Mar. 15-16, 2015. pp. 1-4.

Lee et al., "Oxygen Potential Engineering of Interfacial Layer for Deep Sub-nm EOT High/k Gate Stacks on Ge," 2013 IEEE International Electron Devices Meeting. Dec. 9-11, 2013. pp. 1-4.

* cited by examiner

HOMOGENEOUS DENSIFICATION OF FILL LAYERS FOR CONTROLLED REVEAL OF VERTICAL FINS

BACKGROUND

Technical Field

The present invention generally relates to processes for controlled exposure of uniform fin heights, and more particularly to uniformly densified fill layers to control etch-back rates for controlled uncovering of vertical fins.

Description of the Related Art

A Field Effect Transistor (FET) typically has a source, a channel, and a drain, where current flows from the source to the drain, and a gate that controls the flow of current through the channel. Field Effect Transistors (FETs) can have a variety of different structures, for example, FETs have been fabricated with the source, channel, and drain formed in the substrate material itself, where the current flows horizontally (i.e., in the plane of the substrate), and FinFETs have been formed with the channel extending outward from the substrate, but where the current also flows horizontally from a source to a drain. The channel for the FinFET can be an upright slab of thin rectangular silicon (Si), commonly referred to as the fin with a gate on the fin, as compared to a MOSFET with a single gate parallel with the plane of the substrate. Depending on the doping of the source and drain, an n-FET or a p-FET can be formed.

Examples of FETs can include a metal-oxide-semiconductor field effect transistor (MOSFET) and an insulated-gate field-effect transistor (IGFET). Two FETs also can be coupled to form a complementary metal oxide semiconductor (CMOS) device, where a p-channel MOSFET and n-channel MOSFET are coupled together.

With ever decreasing device dimensions, forming the individual components and electrical contacts becomes more difficult. An approach is therefore needed that retains the positive aspects of traditional FET structures, while overcoming the scaling issues created by forming smaller device components.

SUMMARY

In accordance with an embodiment of the present invention, a method of forming a densified fill layer is provided. The method includes forming a pair of adjacent vertical fins on a substrate. The method further includes forming an inner liner on the sidewalls of the adjacent vertical fins. The method further includes forming a sacrificial layer on the inner liner. The method further includes forming a fill layer between the pair of adjacent vertical fins, wherein the fill layer is in contact with at least a portion of the sacrificial layer. The method further includes removing at least a portion of the sacrificial layer in contact with the fill layer to form sidewall channels adjacent to the fill layer, and subjecting the fill layer to a densification process to form the densified fill layer.

In accordance with another embodiment of the present invention, a method of controlling the revealed height of a plurality of vertical fins is provided. The method includes forming a plurality of vertical fins on a substrate. The method further includes forming an inner liner on the sidewalls of each of the plurality of vertical fins. The method further includes forming a sacrificial layer on the inner liner. The method further includes introducing a dopant into a portion of the sacrificial layer, wherein a portion of the sacrificial layer remains undoped. The method further includes forming a flowable oxide fill layer between each adjacent pair of the plurality of vertical fins, wherein the fill layer is in contact with the undoped portion of the sacrificial layer. The method further includes removing at least a portion of the undoped portion of the sacrificial layer in contact with the fill layer to form sidewall channels adjacent to the fill layer. The method further includes subjecting the fill layer to a densification process to form a densified fill layer, and forming a channel packing layer in the sidewall channels.

In accordance with yet another embodiment of the present invention, a vertical fin field effect transistor is provided. The vertical fin field effect transistor includes a pair of adjacent vertical fins on a substrate. The vertical fin field effect transistor further includes an inner liner on a lower portion of the sidewalls of the adjacent vertical fins. The vertical fin field effect transistor further includes a channel packing layer on the inner liner. The vertical fin field effect transistor further includes a densified fill layer between the pair of adjacent vertical fins, wherein the densified fill layer is in contact with the channel packing layer. The vertical fin field effect transistor further includes a gate dielectric layer on at least a portion of the adjacent vertical fins, inner liner, channel packing layer, and densified fill layer, and a conductive gate layer on at least a portion of the gate dielectric layer.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

Embodiments of the present invention relate generally to controlling the etching properties of a fill layer through homogeneous densification for controlled fill layer etch-back to expose uniform heights of a plurality of vertical fins. Varying fill layer densities can result in varying etch rates between different sections of the fill layer, and uneven exposure of adjacent vertical fin sidewalls resulting from such uneven etch rates.

Embodiments of the present invention also relate generally to forming sidewall channels adjacent to the fill layer to allow access by a densification agent or densification agent precursors to more of the fill layer surfaces. The sidewall channels can be formed by removing a vertical sacrificial layer from the vertical fins, where sidewall channels can be on opposite sides of the fill layer. The sidewall channels can be formed between the fill layer and an inner liner on the vertical fin sidewall.

Embodiments of the present invention also relate generally to providing uniform channel and gate structure dimensions for vertical fin field effect transistors (FinFETs) by reducing fill layer height variations resulting from inconsistent etching rates of the adjacent fill layer. The fill layer can act as a gauge layer that can determine the positioning of other layers of a gate structure along the height of the vertical fins.

Embodiments of the present invention also relate generally to densifying flowable oxide fill layers using a steam anneal by removing a sacrificial layer to form a channel for the steam to access the vertical sides of the fill layer. The steam anneal can densify the oxide fill layer from the top and side surfaces.

Embodiments of the present invention also relate generally to forming a sacrificial layer from a selectively etchable material that can be removed to form channels adjacent to a fill layer.

Exemplary applications/uses to which the present invention can be applied include, but are not limited to: fin field effect transistors for digital logic device and memory circuits.

It is to be understood that aspects of the present invention will be described in terms of a given illustrative architecture; however, other architectures, structures, substrate materials and process features and steps can be varied within the scope of aspects of the present invention.

Figure 1:
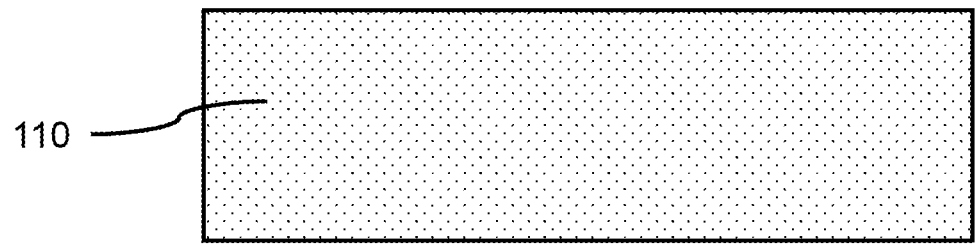
FIG. 1 is a cross-sectional view showing a substrate, in accordance with an embodiment of the present invention.

Referring now to the drawings in which like numerals represent the same or similar elements and initially to FIG. 1, a substrate, in accordance with an embodiment of the present invention, is shown.

In one or more embodiments, a substrate 110 can be, for example, a single crystal semiconductor material wafer or a semiconductor-on-insulator stacked wafer. The substrate can include a support layer that provides structural support, and an active semiconductor layer that can form devices. An insulating layer may be between the active semiconductor layer and the support layer to form a semiconductor-on-insulator substrate (SeOI) (e.g., a silicon-on-insulator substrate (SOI)).

The active semiconductor layer can be a crystalline semiconductor, for example, a IV or IV-IV semiconductor (e.g., silicon (Si), silicon carbide (SiC), silicon-germanium (SiGe), germanium (Ge)), a III-V semiconductor (e.g., gallium-arsenide (GaAs), indium-phosphide (InP), indium-antimonide (InSb)), a II-VI semiconductor (e.g., cadmium-telluride (CdTe), zinc-telluride (ZnTe), zinc sulfide (ZnS), zinc selenide (ZnSe)), or a IV-VI semiconductor (e.g., tin sulfide (SnS), lead selenide (PbSb)).

In various embodiments, the substrate 110 can be a single crystal silicon wafer.

Figure 2:
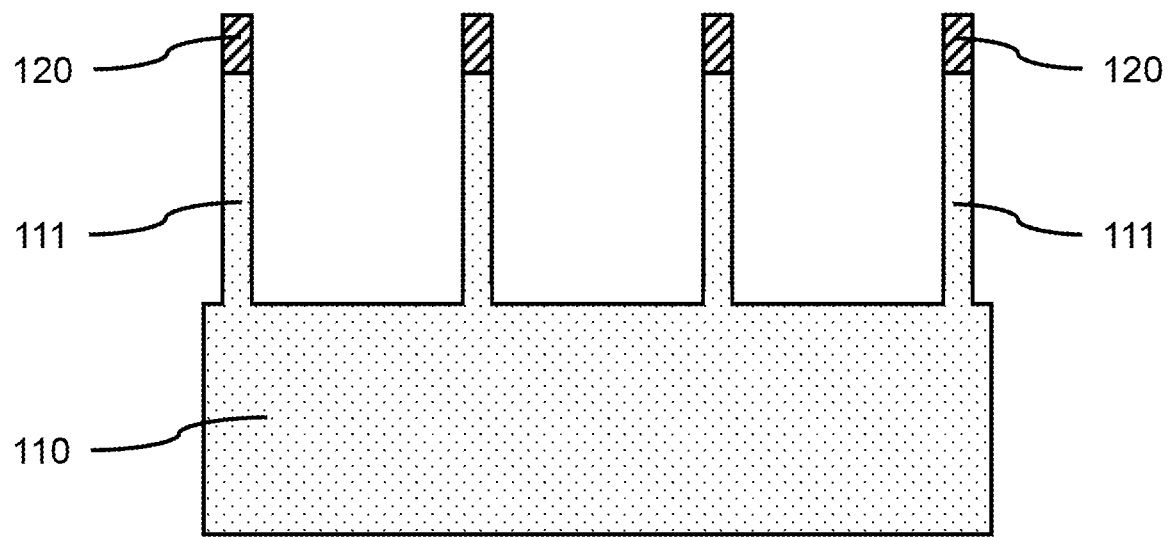
FIG. 2 is a cross-sectional view showing a plurality of vertical fins capped with fin templates on a substrate, in accordance with an embodiment of the present invention.

FIG. 2 is a cross-sectional view showing a plurality of vertical fins capped with fin templates on a substrate, in accordance with an embodiment of the present invention.

In one or more embodiments, a plurality of vertical fins 111 can be formed on the substrate 110, where the vertical fins 111 can be formed by a multiple patterning fabrication process, for example, a sidewall image transfer (SIT) process, a self-aligned double patterning (SADP) process, self-aligned triple patterning (SATP) process, or a self-aligned quadruple patterning (SAQP). The vertical fins 111 may be formed by a direct write process or double patterning process using, for example, immersion lithography, extreme ultraviolet lithography, or x-ray lithography, followed by an etching process.

In various embodiments, the vertical fins 111 can be the same material as the substrate 110. In various embodiments, the vertical fins 111 and substrate 110 are single crystal silicon. In various embodiments, the vertical fins 111 are single crystal silicon-germanium (SiGe), and the substrate 110 is single crystal silicon. In various embodiments, the vertical fins 111 can be two or more materials, where the materials may be graded, for example, continuous or stepwise graded SiGe on a buffer layer.

In various embodiments, a fin template 120 can be on the top of each of the vertical fins 111, where the fin template can be a feature of the fin formation process. The fin template 120 can be a hardmask, for example, silicon oxide (SiO), silicon nitride (SiN), silicon oxynitride (SiON), silicon borocarbonitride (SiBCN), or a combination thereof.

Figure 3:
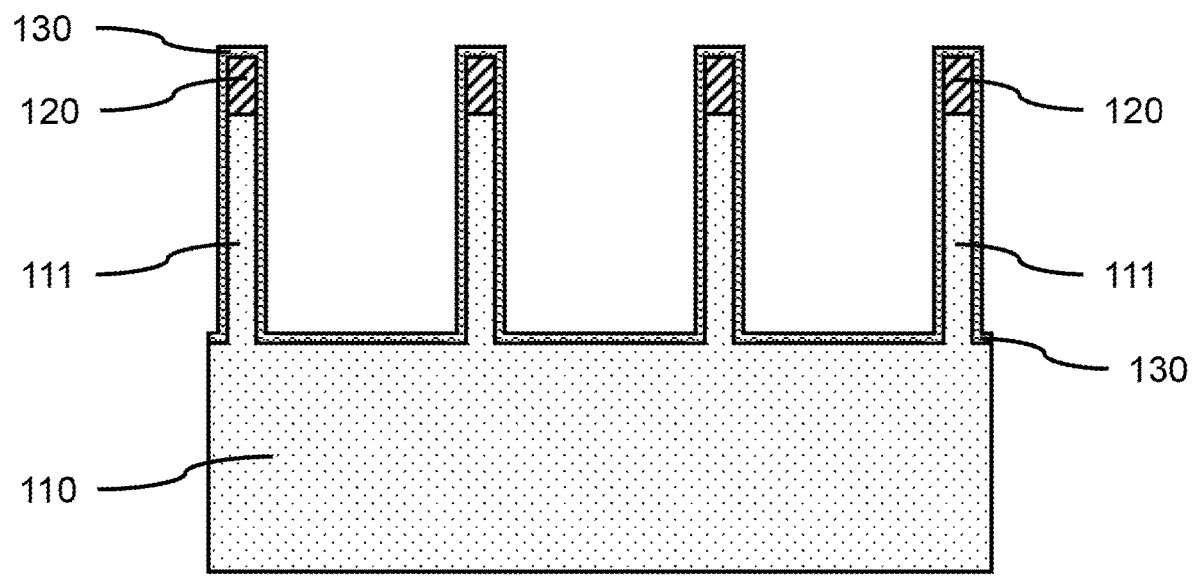
FIG. 3 is a cross-sectional view showing an inner liner on the plurality of vertical fins, fin templates, and substrate, in accordance with an embodiment of the present invention.

FIG. 3 is a cross-sectional view showing an inner liner on the plurality of vertical fins, fin templates, and substrate, in accordance with an embodiment of the present invention.

In one or more embodiments, an inner liner 130 can be formed on the plurality of vertical fins, fin templates 120, and substrate 110. The inner liner 130 can be formed by a conformal deposition, for example atomic layer deposition (ALD), plasma enhanced ALD (PEALD), chemical vapor deposition (CVD), plasma enhanced CVD (PECVD), or a combination thereof.

In various embodiments, the inner liner 130 can be a dielectric material that can be selectively etched relative to the surrounding device materials. The inner liner 130 can be, for example, silicon oxide (SiO), silicon nitride (SiN), silicon oxynitride (SiON), silicon borocarbonitride (SiBCN), or a combination thereof. The inner liner 130 may be selectively removed relative to the fin templates 120. The inner liner 130 can be a dielectric material that protects underlying materials (i.e., vertical fins 111, substrate 110) from an oxidizing species to slow down or prevent the oxidation of the vertical fin sidewalls. In various embodiments, the inner liner can be silicon nitride (SiN).

In various embodiments, the inner liner 130 can have a thickness in the range of about 3 nm to about 8 nm, or about 4 nm to about 6 nm.

Figure 4:
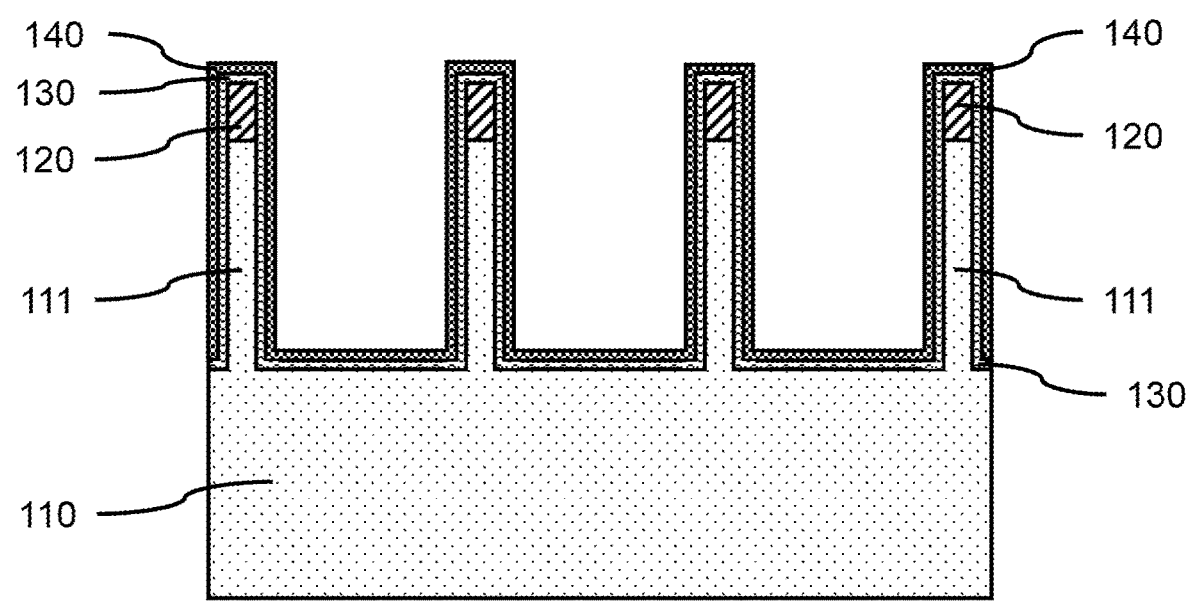
FIG. 4 is a cross-sectional view showing a sacrificial layer on the inner liner and plurality of vertical fins, in accordance with an embodiment of the present invention.

FIG. 4 is a cross-sectional view showing a sacrificial layer on the inner liner and plurality of vertical fins, in accordance with an embodiment of the present invention.

In one or more embodiments, a sacrificial layer 140 can be formed on the inner liner 130 and plurality of vertical fins 111, where the sacrificial layer 140 can be formed by a conformal deposition (e.g., ALD, PEALD, CVD, PECVD). The sacrificial layer 140 can be a semiconductor oxide material (e.g., GeO) or amorphous carbon (a-C) that can be selectively removed relative to the inner liner 130 and subsequently formed fill layer. In various embodiments, the sacrificial layer 140 can be germanium dioxide ($GeO_2$) or amorphous carbon (a-C). The germanium dioxide ($GeO_2$) or amorphous carbon (a-C) can be selectively removed relative to the other materials present using materials that do not etch the other materials, for example, $GeO_2$ can be removed using deionized water ($DI-H_2O$), and a-C can be removed using an ozone ($O_3$) or oxygen ($O_2$) plasma etch.

In various embodiments, the sacrificial layer 140 can have a thickness in the range of about 2 nm to about 10 nm, or about 4 nm to about 7 nm, where the sacrificial layer 140 can form a channel wide enough for gaseous reactants to reach the bottom of the channel.

Figure 5:
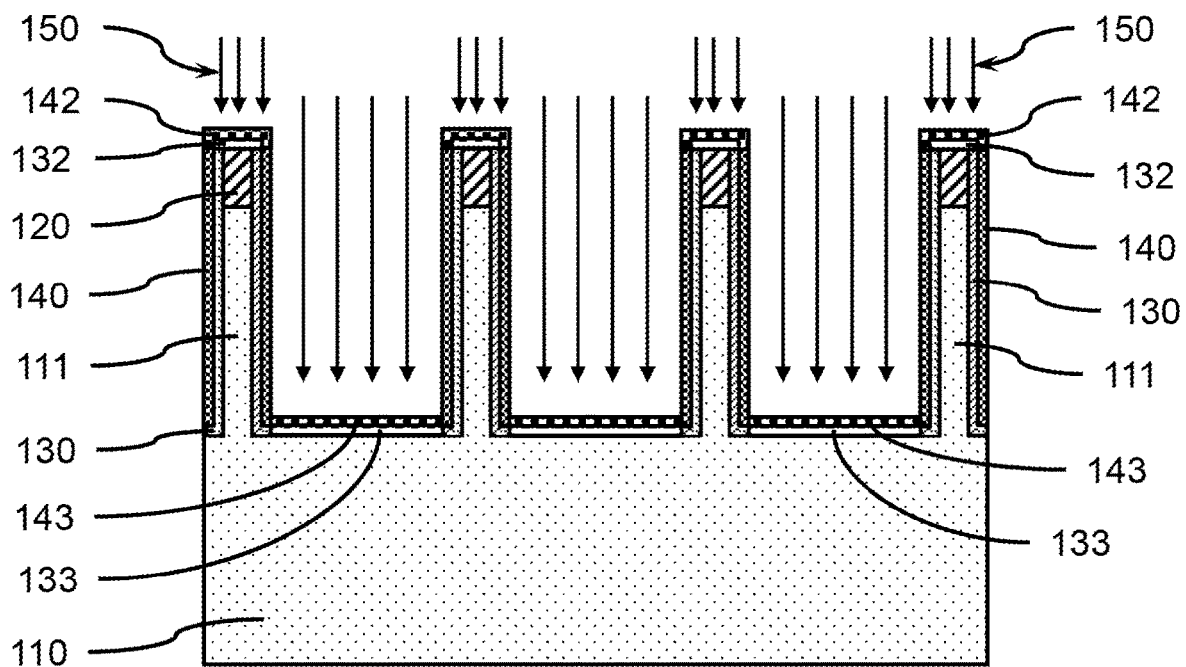
FIG. 5 is a cross-sectional view showing dopant implantation of portions of the sacrificial layer and the inner liner to form doped sacrificial caps, doped sacrificial layer sections, and doped liner sections, in accordance with an embodiment of the present invention.

FIG. 5 is a cross-sectional view showing dopant implantation of portions of the sacrificial layer and the inner liner to form doped sacrificial caps, doped sacrificial layer sections, and doped liner sections, in accordance with an embodiment of the present invention.

In one or more embodiments, a dopant 150 can be implanted into the exposed portions of the sacrificial layer 140 and underlying portions of the inner liner 130, where the dopant implantation forms doped sacrificial caps 142, doped sacrificial layer sections 143, doped liner caps 132, and doped liner sections 133. The implantation can be a directional process, for example, ion beam implantation, where the directional implantation can modify the horizontal surfaces of the sacrificial layer 140 and underlying portions of the inner liner 130 to form doped sacrificial layer sections 143 and doped liner sections 133, as well as, doped sacrificial caps 142 and doped liner caps 132, while leaving the vertical surfaces essentially parallel with the ion beam unmodified (i.e., undoped). The dopant implantation can modify the etching characteristics of the sacrificial layer 140 such that the unmodified vertical portions of the sacrificial layer 140 can be selectively removed by etching, whereas the doped sacrificial caps 142, doped sacrificial layer sections 143, doped liner caps 132, and doped liner sections 133 remain after etching. The inner liner 130 can be sufficiently thick to prevent implantation of the dopant(s) into the underlying substrate 110 and top portions of the fin templates 120, where a bottom portion of the inner liner 130 may not become doped.

In various embodiments using amorphous carbon for the sacrificial layer 140, doping may be skipped. The vertical portions of the amorphous carbon sacrificial layer 140 can be removed through a controlled selective etch (e.g., $O_2$ or $O_3$ plasma etch).

In one or more embodiments, the dopants can be yttrium (Y), aluminum (Al), scandium (Sc), or a combination thereof. In various embodiments, the concentration of the dopant in the doped sacrificial caps 142 and doped sacrificial layer sections 143 can be in the range of about 1 atomic percent (at. %) to about 30 at. %, or in the range of about 6 at. % to about 30 at. %, or in the range of about 10 at. % to about 30 at. %, or in the range of about 20 at. % to about 30 at. %, or at least 20 at. %, where the dopant concentration can be sufficient to reduce the etching rate of the doped sacrificial caps 142 and doped sacrificial layer sections 143 to avoid measurable etching for the time necessary to remove the undoped (i.e., unmodified) portions of the sacrificial layer 140.

In various embodiments, the addition of the dopant to portions of the sacrificial layer 140 and inner liner 130 can alter the etching rate of these doped layers, where the etching rate can decrease with increasing amounts of dopant. In various embodiments, a $GeO_2$ sacrificial layer 140 can have a wet etching rate in $DI-H_2O$ of about 20 nm/s, whereas a $GeO_2$ sacrificial layer 140 with a 10 at. % aluminum (Al) dopant concentration can have a wet etching rate of about 9 nm/s, a $GeO_2$ sacrificial layer 140 with a 10 at. % scandium (Sc) dopant concentration can have a wet etching rate of about 0.008 to about 0.009 nm/s, and a $GeO_2$ sacrificial layer 140 with a 10 at. % yttrium (Y) dopant concentration can have a wet etching rate of about 0.004 nm/s to about 0.005 nm/s. A yttrium (Y) or scandium (Sc) dopant concentration of greater than 20 at. % can make the $GeO_2$ effectively insoluble in $DI-H_2O$, and a 20 at. % aluminum (Al) dopant concentration can reduce the etching rate to a negligible amount for etching times sufficient to remove the undoped sacrificial layer 140.

Figure 6:
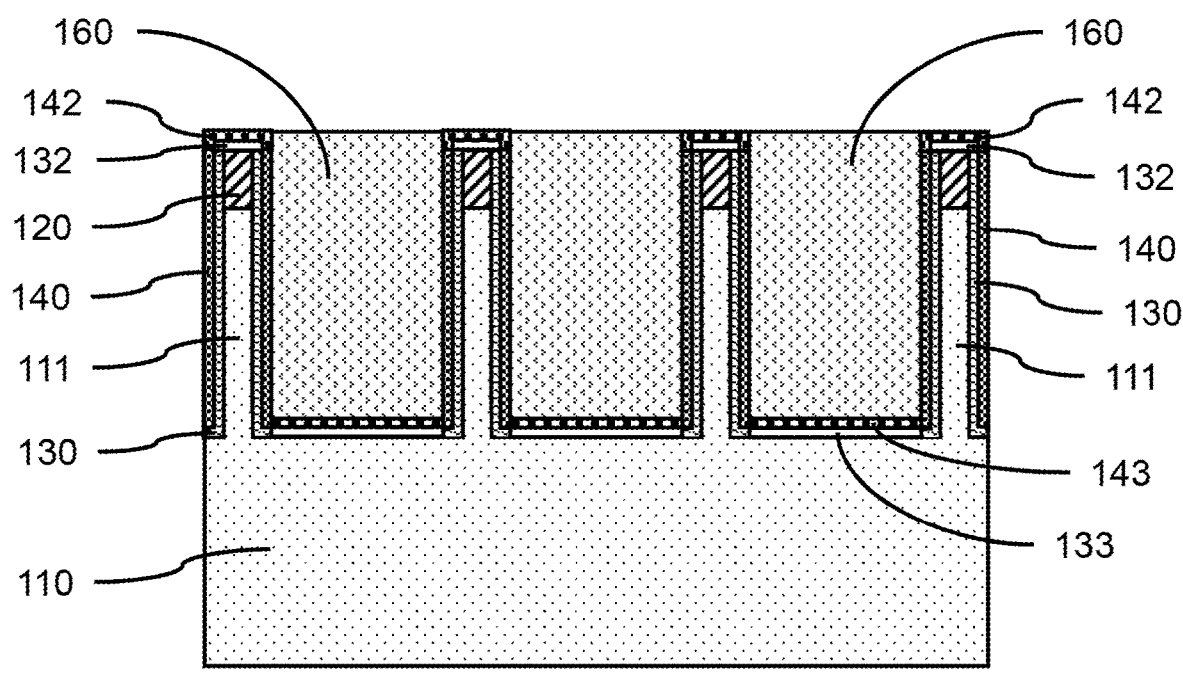
FIG. 6 is a cross-sectional view showing a fill layer formed on the sacrificial layer between each pair of adjacent vertical fins, in accordance with an embodiment of the present invention.

FIG. 6 is a cross-sectional view showing a fill layer formed on the sacrificial layer between each pair of adjacent vertical fins, in accordance with an embodiment of the present invention.

In one or more embodiments, a fill layer 160 can be formed in the spaces between the vertical fins 111, where the fill layer 160 can be formed on the doped sacrificial caps 142, doped sacrificial layer sections 143, and undoped portions of the sacrificial layer 140. The fill layer 160 can extend above the top surfaces of the doped sacrificial caps 142, and a chemical-mechanical polishing (CMP) can be used to reduce the height of the fill layer 160 to the top of the doped sacrificial caps 142, and provide a smooth planarized surface.

In various embodiments, the fill layer 160 can be a flowable oxide, where the fill layer 160 can be formed by spin-coating, chemical vapor deposition (CVD), or as a spin-on-glass. The flowable oxide can fill in the narrow gaps with a high aspect ratio (ratio between gap height and gap width >8:1). The flowable oxide can have very high etch rates when exposed to oxide etch chemicals, such as hydrofluoric acid (HF). Flowable oxides can be polymeric materials including silicon, oxygen, and alkyl groups (e.g., methyl (—$CH_3$) and methylene (—$CH_2$—) components) that affect the electrical and mechanical properties of the as-deposited fill layer 160. The hardness and bulk modulus of such a fill layer 160 are below the values of silicon dioxide ($SiO_2$), and the fill layer 160 can be non-crystalline.

Figure 7:
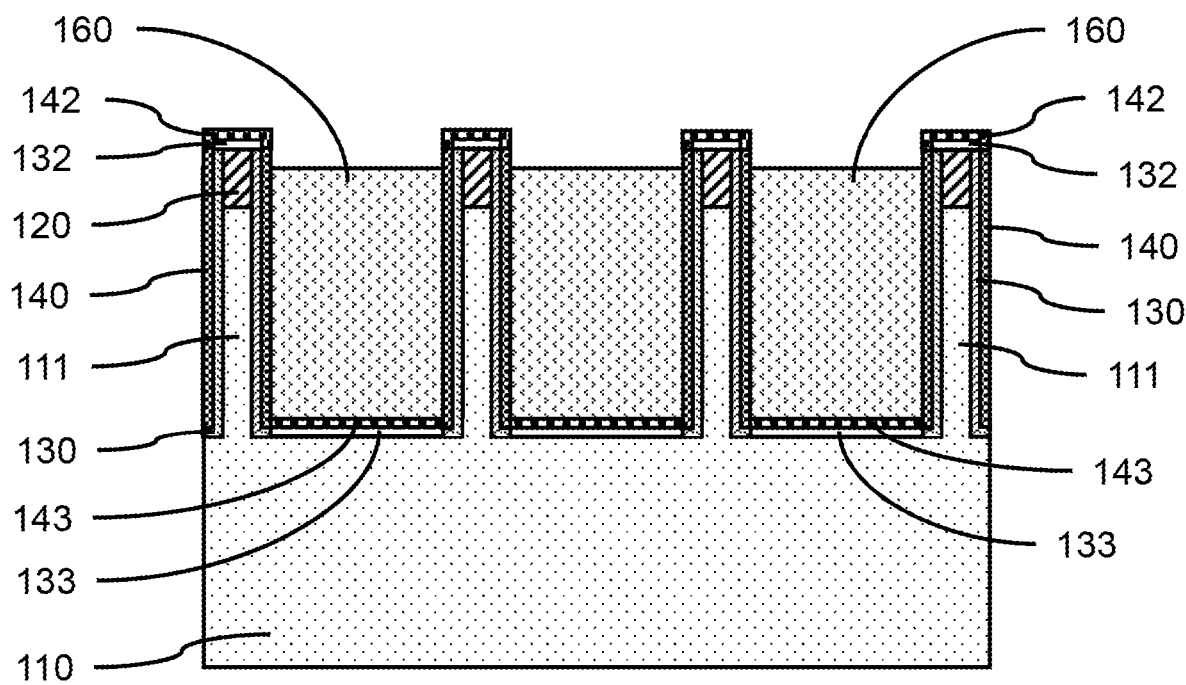
FIG. 7 is a cross-sectional view showing a fill layer with a reduced height between each pair of vertical fins, in accordance with an embodiment of the present invention.

FIG. 7 is a cross-sectional view showing a fill layer with a reduced height between each pair of vertical fins, in accordance with an embodiment of the present invention.

In one or more embodiments, the height of the fill layer 160 can be reduced to expose a portion of the undoped sacrificial layer 140 on the sidewalls of the vertical fins 111 and/or fin templates 120. The height of the fill layer 160 can be reduced using a directional etch, for example, a reactive ion etch (RIE). The top surface of the fill layer 160 can still be above the tops of the vertical fins 111 after the height of the fill layer 160 has been reduced, so at least a portion of the undoped sacrificial layer 140 on the sidewalls of the fin templates 120 can be exposed, but the fill layer covers the doped sacrificial layer sections 143.

Figure 8:
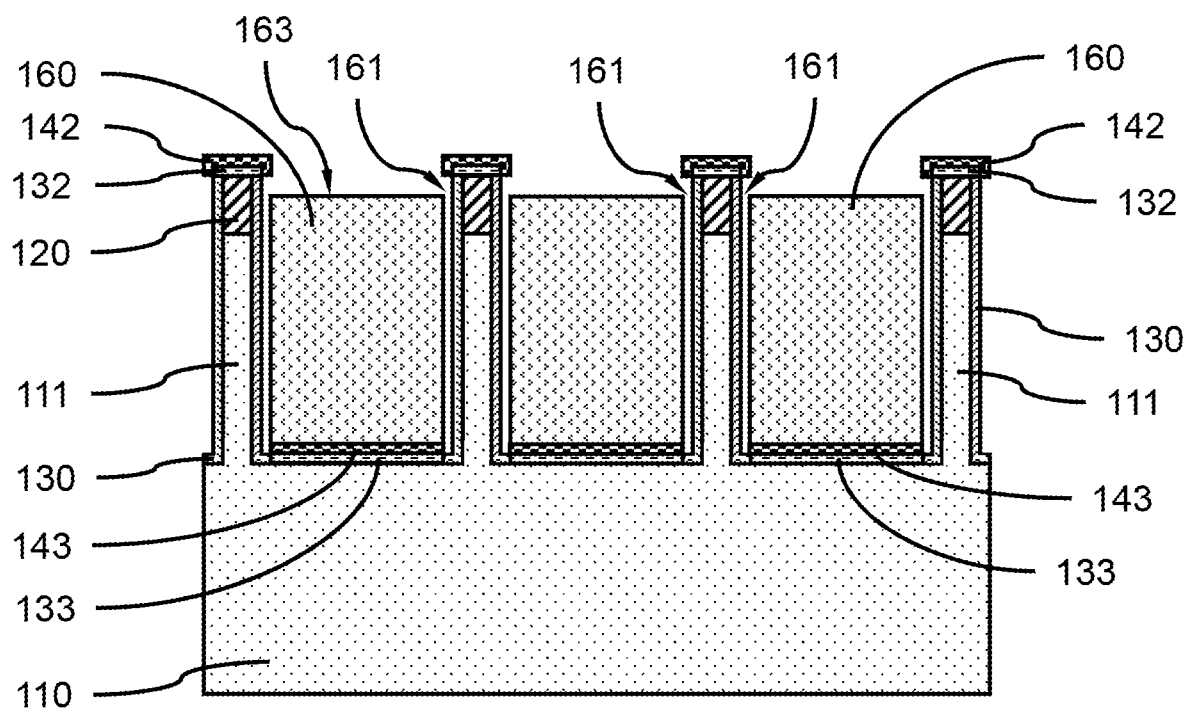
FIG. 8 is a cross-sectional view showing the removal of an undoped portion of the sacrificial layer from the inner liners on the vertical fins to form sidewall channels, in accordance with an embodiment of the present invention.

FIG. 8 is a cross-sectional view showing the removal of an undoped portion of the sacrificial layer from the inner liners on the vertical fins to form sidewall channels, in accordance with an embodiment of the present invention.

In one or more embodiments, the undoped portions of the sacrificial layer 140 can be removed from the inner liner 130 on the vertical fins 111 to form sidewall channels 161, where the undoped portions of the sacrificial layer 140 can be removed using a selective isotropic etch, (e.g., wet chemical etch, dry plasma etch). A sidewall channel 161 can be formed on each of opposite sides of the fill layer 160 by removing an undoped portion of the sacrificial layer 140 from an adjacent pair of vertical fins 111. Removal of the undoped portions of the sacrificial layer 140 can expose the sidewalls of the fill layer 160, and provide a path for gaseous reactants to access surfaces of the fill layer 160 in addition to the exposed top surface 163.

In various embodiments, the entire undoped portion of the sacrificial layer 140 may not be removed. A portion of the sacrificial layer 140 may remain on a bottom portion of the inner liner 130 on the vertical fin 111 sidewalls. The sidewall channel 161 may expose the entire sidewall of the fill layer 160, where an undoped portion of the sacrificial layer 140 remains adjacent to the doped sacrificial layer section 143, or a lower portion of the fill layer 160 may remain covered by a portion of the undoped sacrificial layer 140. The sidewall channel 161 may extend farther down the vertical fin sidewalls than a subsequently formed gate structure and FinFET device channel region.

In embodiments in which the sacrificial layer 140 and doped sacrificial caps 142 are germanium dioxide ($GeO_2$), the sacrificial layer 140 can be removed using deionized water (DI-$H_2O$). In embodiments in which the sacrificial layer 140 and doped sacrificial caps 142 are amorphous carbon (a-C), the sacrificial layer 140 can be removed using an oxygen plasma etch or ozone ($O_3$) etch.

Figure 9:
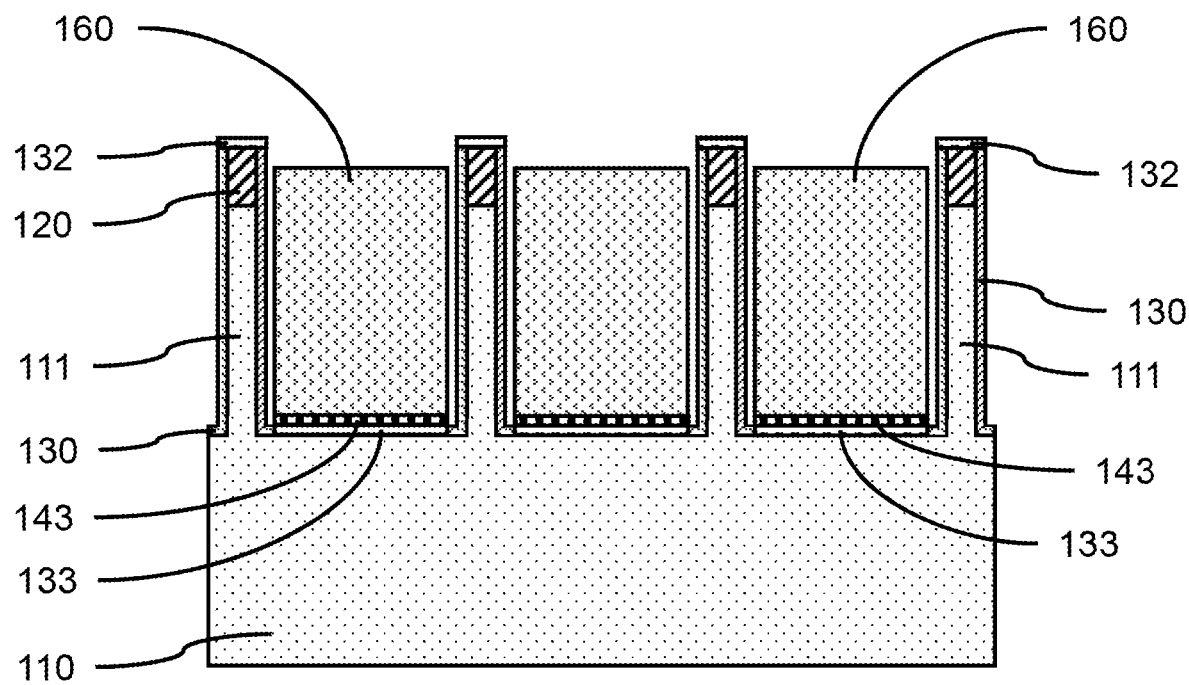
FIG. 9 is a cross-sectional view showing the removal of the doped sacrificial caps from the doped liner caps on the vertical fins, in accordance with an embodiment of the present invention.

FIG. 9 is a cross-sectional view showing the removal of the doped sacrificial caps from the doped liner caps on the vertical fins, in accordance with an embodiment of the present invention.

In one or more embodiments, the doped sacrificial caps 142 can be removed from the doped liner caps 132 on the vertical fins 111. In embodiments in which the doped sacrificial caps 142 are germanium dioxide ($GeO_2$), the doped sacrificial caps 142 can be removed using a hydrogen chloride (HCl) etch.

Figure 10:
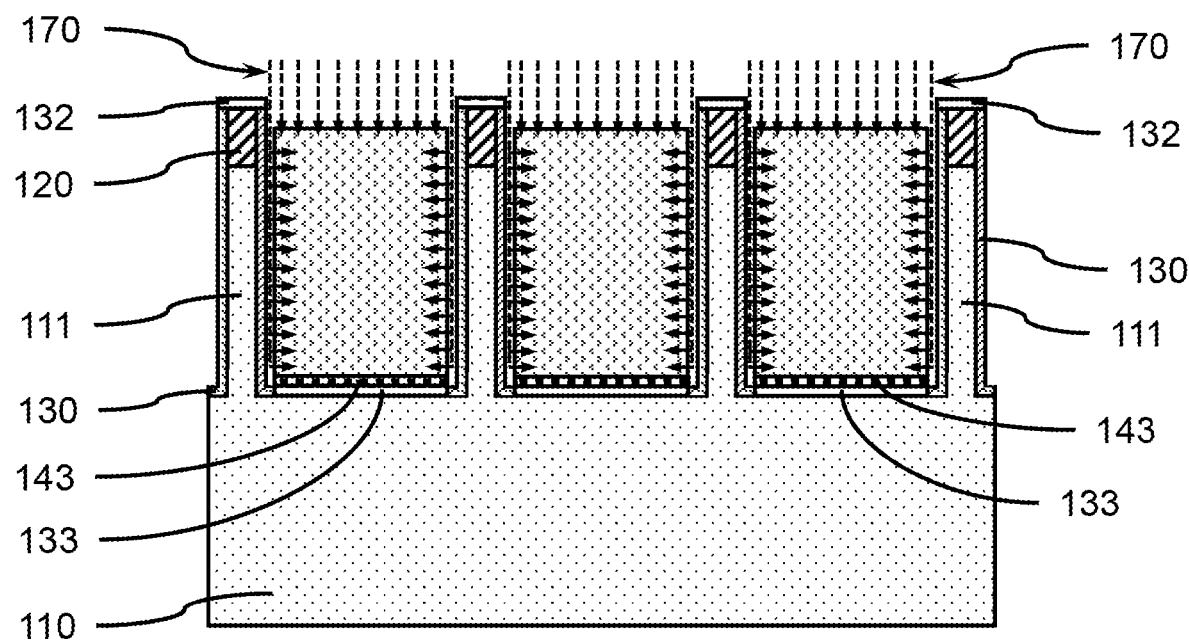
FIG. 10 is a cross-sectional view showing uniform densification of the fill layer utilizing the sidewall channels, in accordance with an embodiment of the present invention.

FIG. 10 is a cross-sectional view showing uniform densification of the fill layer utilizing the sidewall channels, in accordance with an embodiment of the present invention.

In one or more embodiments, the fill layer 160 can be subjected to a densification process, where a densification agent or densification agent precursors 170 can be introduced into the sidewall channels 161. In various embodiments, the densification process can be a steam anneal, where gaseous $H_2O$ is the densification agent 170, or an anneal in an oxygen ($O_2$) gas atmosphere, where $O_2$ gas is the densification agent 170. The densification process can also be an anneal in a mixture of hydrogen ($H_2$) gas and oxygen ($O_2$) gas, where the densification agent precursors ($H_2$, $O_2$) can react to form water ($H_2O$) vapor that acts as the densification agent. The densification agent or densification agent precursors 170 can enter the sidewall channels 161 to access at least a portion of the sidewalls of the fill layer 160. In various embodiments, the densification agent or densification agent precursors 170 can diffuse into the fill layer 160 from multiple surfaces exposed to the densification agent or densification agent precursors.

In various embodiments, the densification process can be conducted at a temperature in the range of about 450° C. to about 800° C., or about 500° C. to about 700° C. The annealing time can be in the range of about 1 minute to about 1 hour depending on the annealing temperature. The densification process can reduce the amount of carbon, for example, in the form of methyl (—$CH_3$) and methylene (—$CH_2$—) components, and increase the Si—O bonding to increase the density of the fill layer 160, where the densification can be homogeneous through the fill layer 160. In various embodiments, greater than 90% of the carbon may be removed from the fill layer 160.

The fill layer 160 can act as an isolation region between the vertical fins 111.

Figure 11:
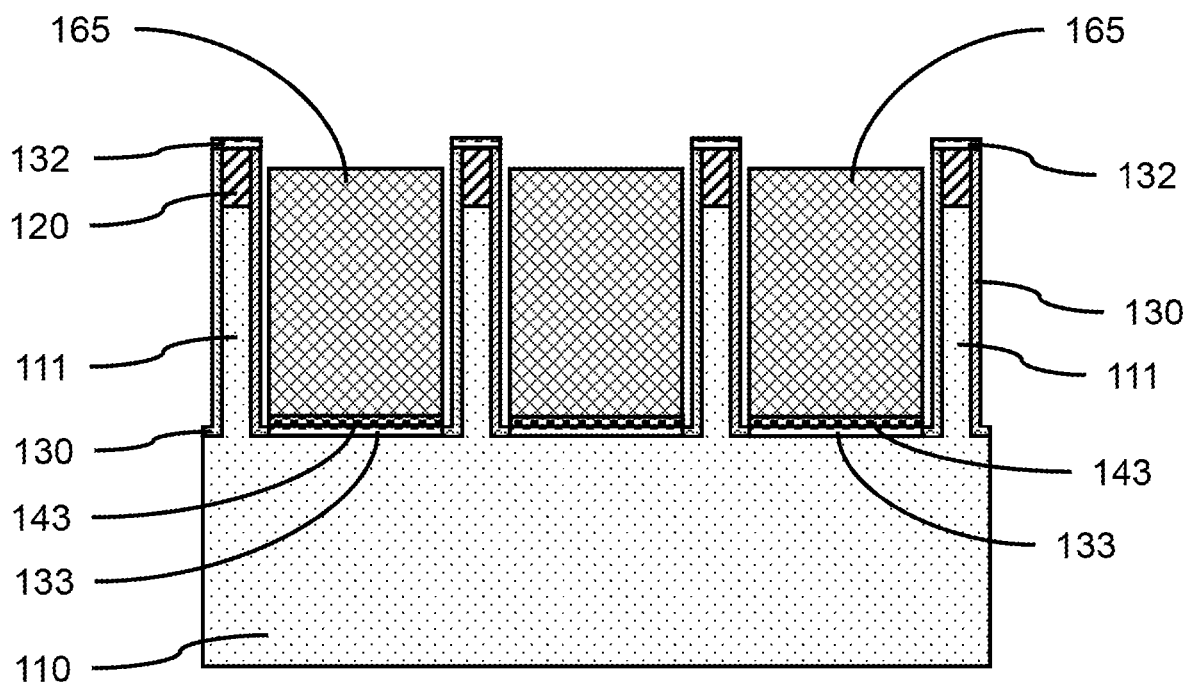
FIG. 11 is a cross-sectional view showing a densified fill layer on the doped sacrificial layer sections and doped liner sections, in accordance with an embodiment of the present invention.

FIG. 11 is a cross-sectional view showing a densified fill layer on the doped sacrificial layer sections and doped liner sections, in accordance with an embodiment of the present invention.

The densification process can convert the fill layer 160 into a uniform densified fill layer 165. After the densification process, most carbon (>90%) and hydrogen (>90%) can be removed from the fill layer 160, leaving mainly silicon and oxygen. The densified fill layer 165 can be essentially silicon oxide (SiO) with some residual hydrogen and carbon. The densified fill layer 165 can have a dielectric constant of less than 3.9 (<3.9), or less than 3.0 (<3.0), or less than 2.7 (<2.7). The densified fill layer 165 can have a bulk modulus greater than 8 gigapascals (>8 GPa), or a bulk modulus greater than 20 GPa (>20 GPa), and a hardness greater than 1 GPa.

Figure 12:
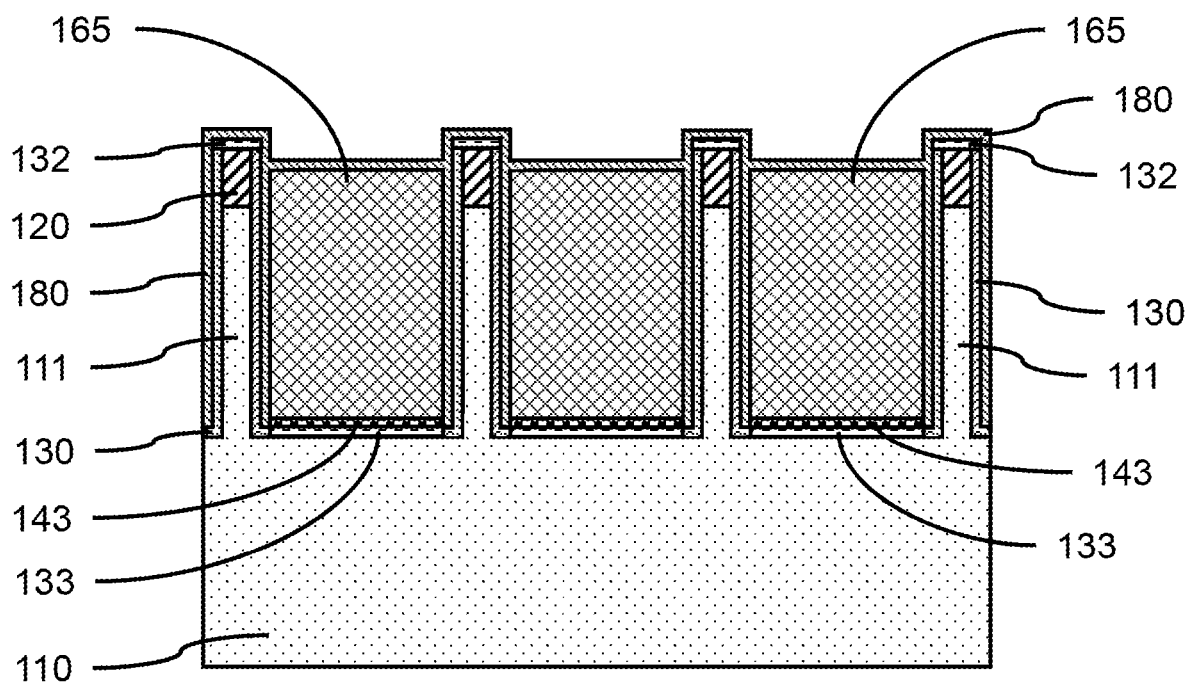
FIG. 12 is a cross-sectional view showing a channel packing layer formed in the sidewall channels adjoining the densified fill layer, in accordance with an embodiment of the present invention.

FIG. 12 is a cross-sectional view showing a channel packing layer formed in the sidewall channels adjoining the densified fill layer, in accordance with an embodiment of the present invention.

In one or more embodiments, a channel packing layer 180 can be formed in the sidewall channels 161 adjoining the densified fill layer 165. The channel packing layer 180 can be formed by a low pressure chemical vapor deposition (LPCVD), such that the channel packing layer 180 fills in the gaps between the inner liner 130 on the vertical fin sidewalls and the densified fill layer 165. Other suitable deposition techniques include but are not limited to CVD, plasma enhanced CVD, molecular layer deposition (MLD), high temperature oxide deposition (HTO), etc. The channel packing layer 180 can form on the exposed surfaces of the doped liner caps 132.

In various embodiments, the channel packing layer 180 can be a silicon oxide (SiO), silicon nitride (SiN), silicon oxynitride (SiON), silicon borocarbonitride (SiBCN), silicon carbonitride (SiCN), silicon oxycarbide (SiOC), silicon borocarbide (SiBC), and combinations thereof.

Figure 13:
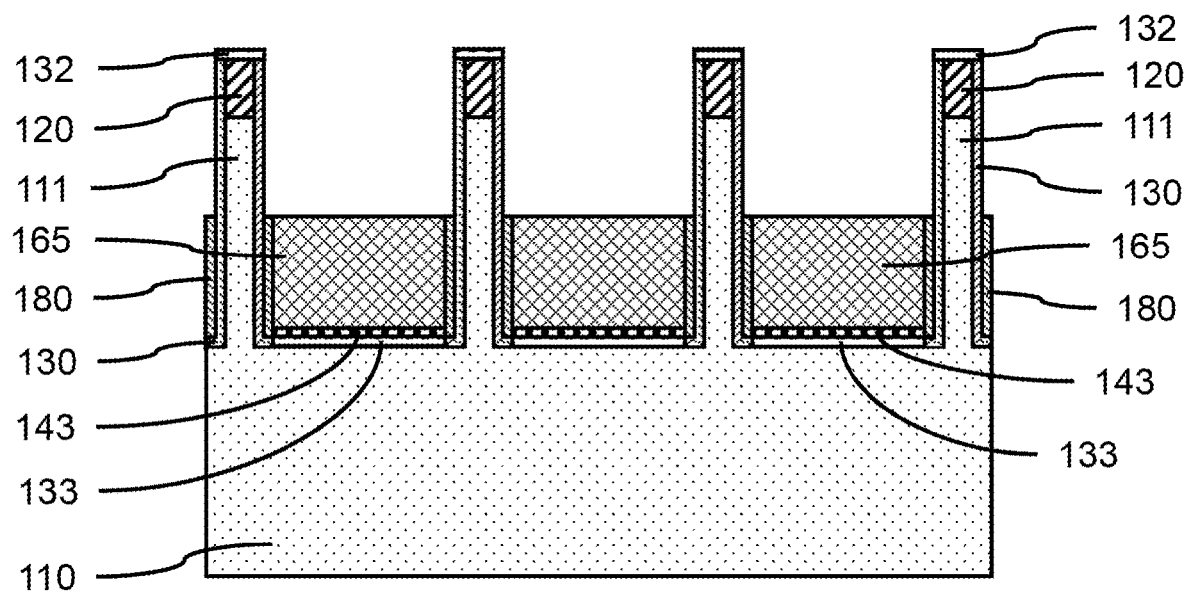
FIG. 13 is a cross-sectional view showing the uniform reduction in height of the channel packing layer and densified fill layer, in accordance with an embodiment of the present invention.

FIG. 13 is a cross-sectional view showing the uniform reduction in height of the channel packing layer and densified fill layer, in accordance with an embodiment of the present invention.

In one or more embodiments, the height of the channel packing layer 180 and densified fill layer 165 can be reduced, for example, by an isotropic (e.g., wet etch), a directional etch (e.g., RIE), or a combination of an isotropic etch and directional etch. The resulting variation in the reduction in height of the densified fill layer 165 between different pairs of vertical fins is less than if the fill layer 160 was not densified. The etch rates of the densified fill layer 165 can be more uniform and consistent than a fill layer that had undergone a densification process with only the top surface of the fill layer 160 exposed to the densification agent (e.g., $H_2O$).

In various embodiments, the height of the channel packing layer 180 and densified fill layer 165 can be reduced by about 20 nm to about 80 nm, or by about 40 nm to about 60 nm. By densifying the fill layer 165 from the top and the sides, and rendering the density uniform with a film qualify independent of the size of the gap between adjacent fins and the vertical depth of the fill layer 160, the actual improvement in the recess uniformity can be significant. For example, for a target fin height of about 50 nm, without densification, the actual fin height may vary from 45 nm to 55 nm, which is equivalent to a 10 nm fin height variation. Such a large variation can be primarily due to the variation in the film quality of the fill layer. In contrast, by improving the fill layer 160 uniformity by top and side densification, the fin height variation can be reduced below 5 nm (e.g., <10% variation).

Figure 14:
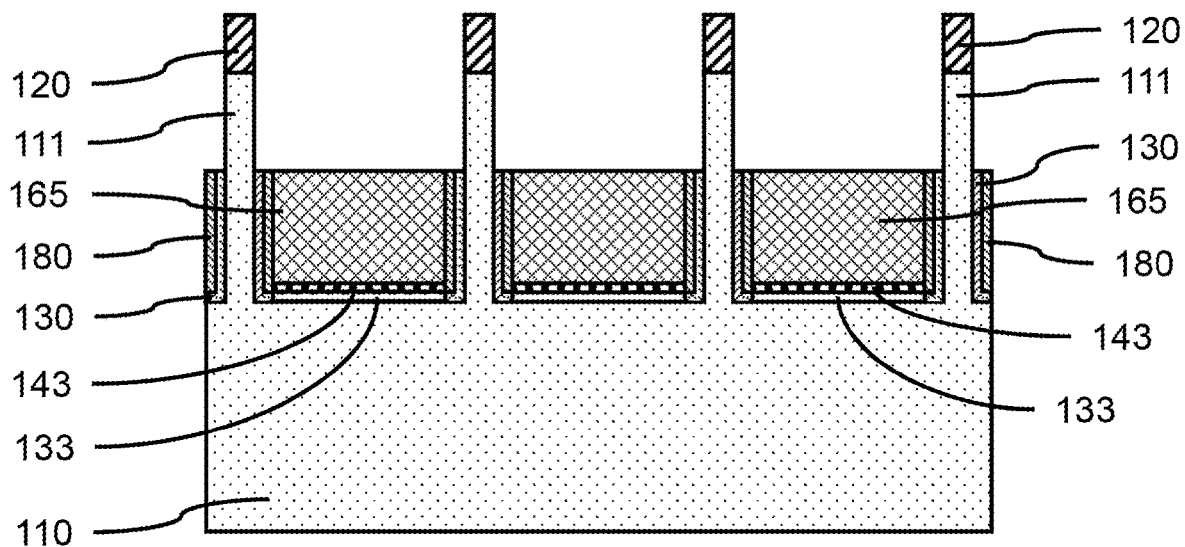
FIG. 14 is a cross-sectional view showing the reduction in height of the inner liner adjoining the channel packing layer to expose an upper portion of the vertical fins, in accordance with an embodiment of the present invention.

FIG. 14 is a cross-sectional view showing the reduction in height of the inner liner adjoining the channel packing layer to expose an upper portion of the vertical fins, in accordance with an embodiment of the present invention.

In one or more embodiments, the portion of the inner liner 130 on the sidewalls of the vertical fins 111 exposed after reducing the height of the channel packing layer 180 and densified fill layer 165 can be removed. The removal of the inner liner 130 on the sidewalls of the vertical fins 111 can expose an upper portion of the vertical fins 111. A portion of the inner liner 130 can remain on a lower portion the sidewalls of the vertical fins 111, where the portion of the inner liner 130 is covered by the channel packing layer. In various embodiments, the densified fill layer 165, channel packing layer 180, and inner liner 130 can be recessed sequentially. In various embodiments, the densified fill layer 165, channel packing layer 180, and inner liner 130 can be recessed together at the same time. The doped liner caps 132 can also be removed with a selective etch.

Figure 15:
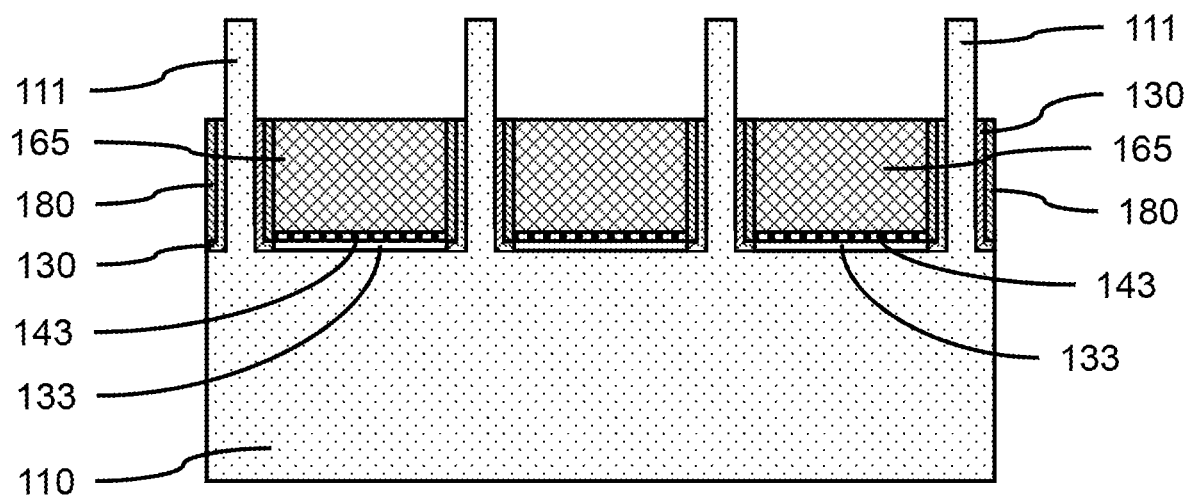
FIG. 15 is a cross-sectional view showing the removal of the fin templates from each of the vertical fins to expose the top surfaces, in accordance with an embodiment of the present invention.

FIG. 15 is a cross-sectional view showing the removal of the fin templates from each of the vertical fins to expose the top surfaces, in accordance with an embodiment of the present invention.

In one or more embodiments, the fin templates 120 can be removed to expose the top surfaces of the vertical fins 111, where the fin templates 120 can be removed using a selective etch.

Figure 16:
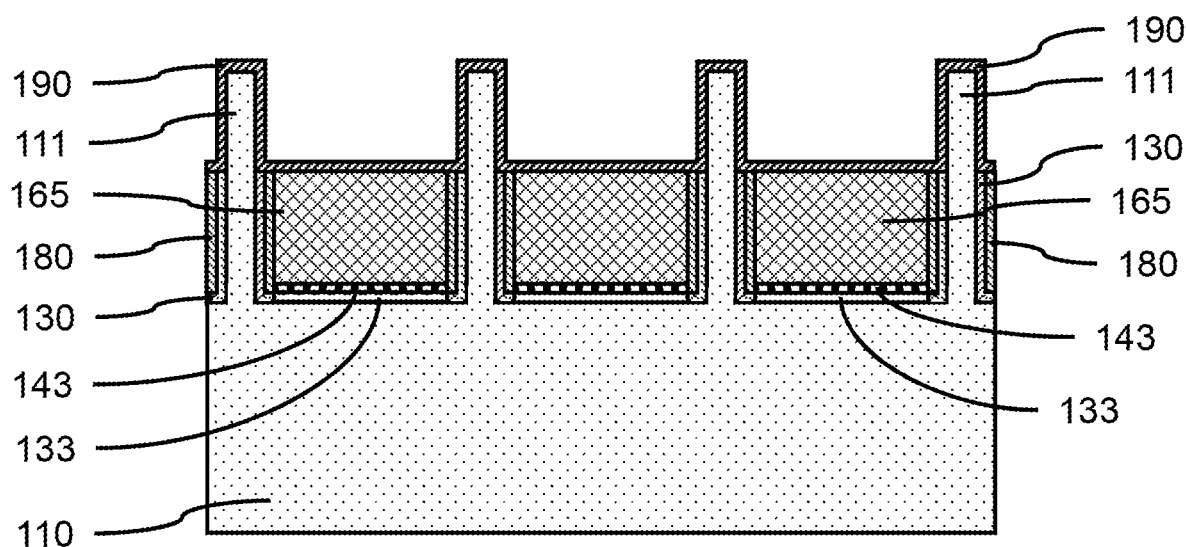
FIG. 16 is a cross-sectional view showing a gate dielectric layer formed on the exposed upper portion of the vertical fins, in accordance with an embodiment of the present invention.

FIG. 16 is a cross-sectional view showing a gate dielectric layer formed on the exposed upper portion of the vertical fins, in accordance with an embodiment of the present invention.

In one or more embodiments, a gate dielectric layer 190 can be formed on the exposed upper portion of the vertical fins 111, where the gate dielectric layer 190 can be formed by a conformal deposition (e.g., ALD, PEALD).

In various embodiments, the gate dielectric layer 190 can be silicon oxide (SiO), silicon nitride (SiN), silicon oxynitride (SiON), boron nitride (BN), high-k materials, or a combination of these materials. Examples of high-k materials include but are not limited to metal oxides, such as, hafnium oxide (HfO), hafnium silicon oxide (HfSiO), hafnium silicon oxynitride (HfSiON), lanthanum oxide (LaO), lanthanum aluminum oxide (LaAlO), zirconium oxide (ZrO), zirconium silicon oxide (ZrSiO), zirconium silicon oxynitride (ZrSiON), tantalum oxide (TaO), titanium oxide (TiO), barium strontium titanium oxide (BaSrTiO), barium titanium oxide (BaTiO), strontium titanium oxide (SrTiO), yttrium oxide (YO), aluminum oxide (AlO), lead scandium tantalum oxide (PbScTaO), and lead zinc niobate (PbZnNbO). The high-k may further include dopants such as lanthanum, aluminum, magnesium, or combinations thereof.

Figure 17:
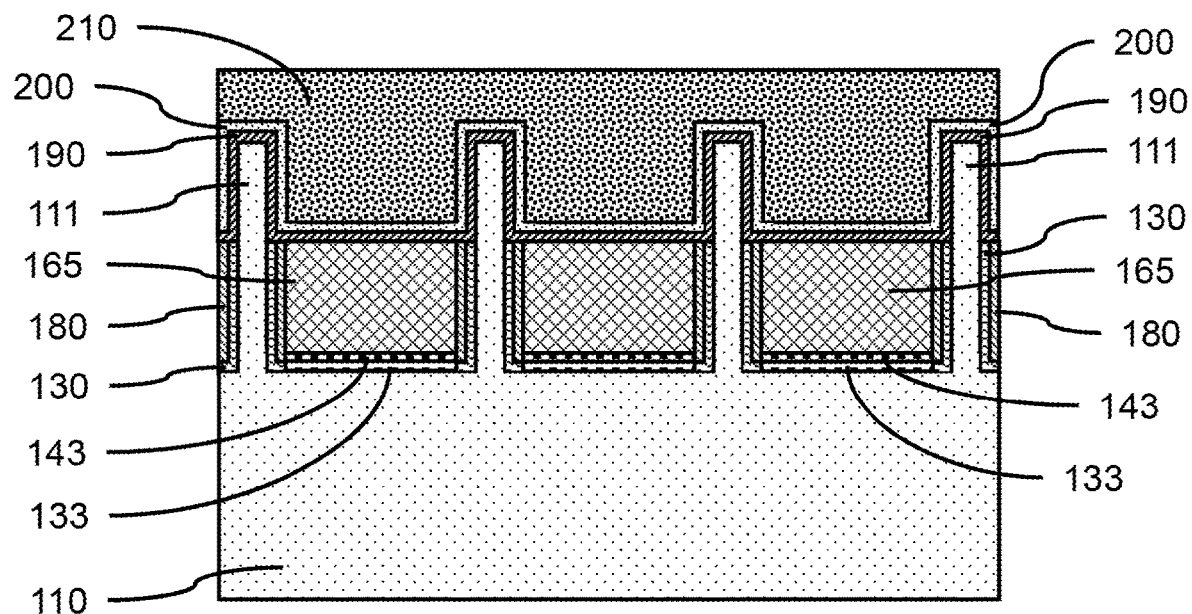
FIG. 17 is a cross-sectional view showing a work function material layer and conductive gate layer formed on the gate dielectric layer, in accordance with an embodiment of the present invention.

FIG. 17 is a cross-sectional view showing a work function material layer and conductive gate layer formed on the gate dielectric layer, in accordance with an embodiment of the present invention.

In one or more embodiments, a work function material (WFM) layer 200 can be formed on a portion of the gate dielectric layer 190 to form a gate structure for a fin field effect transistor (FinFET). In various embodiments, the current can flow horizontally through a channel region below the gate structure.

In various embodiments, the work function layer 200 can include, but not necessarily be limited to, titanium nitride (TiN), tantalum nitride (TaN) or ruthenium (Ru), for a PFET. The work function layer 200 can include, but not necessarily be limited to, titanium nitride (TiN), titanium aluminum nitride (TiAlN), titanium aluminum carbon nitride (TiAlCN), titanium aluminum carbide (TiAlC), tantalum aluminum carbide (TaAlC), tantalum aluminum carbon nitride (TaAlCN) or lanthanum (La) doped TiN or TaN, for an NFET. The work function layer 200 can be deposited on the gate dielectric layer 190 by a conformal deposition.

In one or more embodiments, a conductive gate layer 210 can be formed on at least a portion of the work function layer 200 or gate dielectric layer if the work function layer is not present. The conductive gate layer 210 can be formed by a blanket deposition, and a CMP can be used to remove excess material.

In various embodiments, the conductive gate layer 210 can include, but not necessarily be limited to, amorphous silicon (a-Si), or metals, for example, tungsten (W), cobalt (Co), zirconium (Zr), tantalum (Ta), titanium (Ti), aluminum (Al), ruthenium (Ru), copper (Cu), metal carbides (e.g., TaC, TiC, WC, etc.), metal nitrides (e.g., TaN, ZrN, etc.), transition metal aluminides (e.g., TiAl, CoAl, NiAl, etc.), tantalum magnesium carbide, or combinations thereof. The conductive gate layer 210 can be deposited on the WFM layer 200, or the gate dielectric layer 190 if a WFM layer is not present, to form the gate structure.

In various embodiments, additional device elements can be formed, as would be known in the art, to complete fabrication of a device, where the additional device elements can include source/drains, spacers, vias, electrical contacts, interlayer dielectric (ILD) layers, and metallization layers. The additional device elements can be formed by any suitable techniques known to those in the art.

Figure 18:
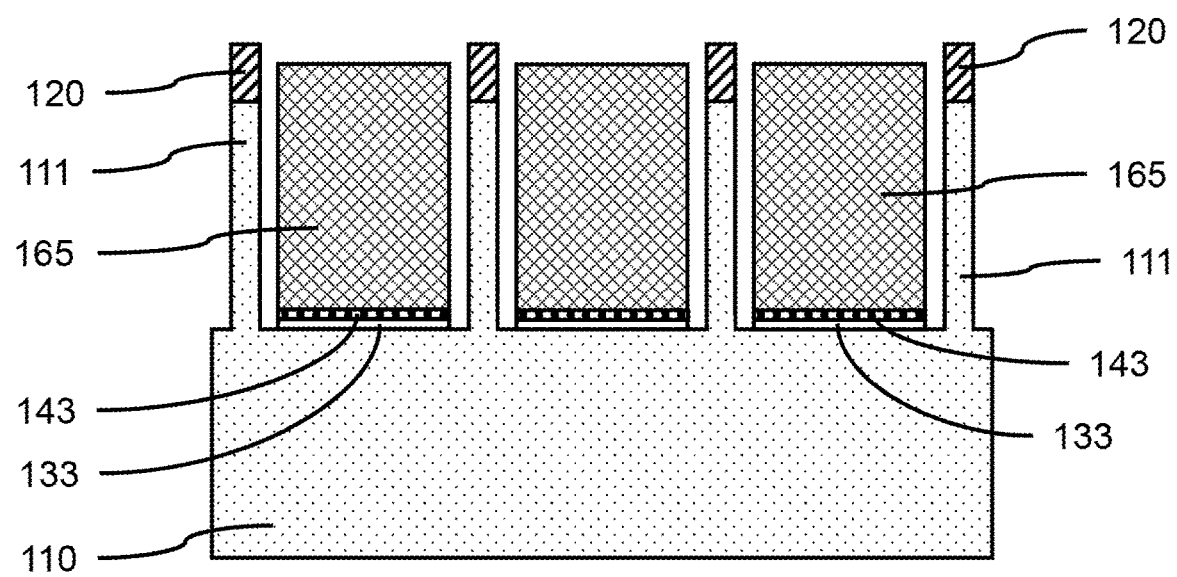
FIG. 18 is a cross-sectional view showing removal of the undoped portion of the inner liner on the vertical fins after densification of the fill layer to form a wider sidewall channel, in accordance with another embodiment of the present invention.

FIG. 18 is a cross-sectional view showing removal of the undoped portion of the inner liner on the vertical fins after densification of the fill layer to form a wider sidewall channel, in accordance with another embodiment of the present invention.

In another embodiment, the undoped portion of the inner liner 130 on the vertical fin sidewalls can be removed to form a wider sidewall channel 161, after densification, but before forming the channel packing layer 180. The undoped inner liner 130 can be removed using a selective isotropic etch (e.g., wet chemical etch), for example, a silicon nitride inner liner 130 can be selectively removed using a phosphoric acid etch, without removing the densified fill layer 165 or etching the vertical fins 111. The sidewall channel 161 can have a total width that is the combined widths of the inner liner 130 and the undoped sacrificial layer 140 on the sidewall of the vertical fin 111. The sidewall channel 161 can extend down to the surface of the substrate 110 with the undoped sacrificial layer 140 and inner liner 130 removed, or portions of the undoped sacrificial layer 140 and inner liner 130 can remain on a bottom portion of the vertical fins 111 below the bottom surface of the densified fill layer 165.

Figure 19:
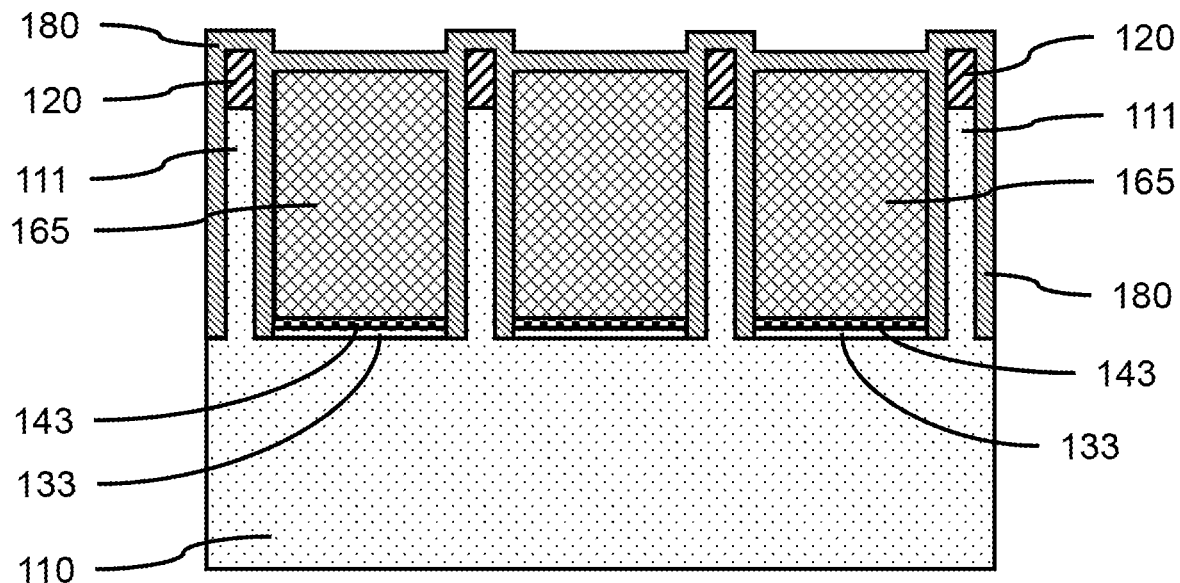
FIG. 19 is a cross-sectional view showing a channel packing layer formed in the wider sidewall channels adjoining the densified fill layer, in accordance with an embodiment of the present invention.

FIG. 19 is a cross-sectional view showing a channel packing layer formed in the wider sidewall channels adjoining the densified fill layer, in accordance with an embodiment of the present invention.

In another embodiment, the channel packing layer 180 can be formed in the wider sidewall channels 161 adjoining the densified fill layer 165. The channel packing layer 180 can be formed by a low pressure chemical vapor deposition (LPCVD).

In one or more embodiments, the height of the densified fill layer 165 can be reduced before formation of the channel packing layer 180 in the sidewall channels 161. The fin templates 120 can also be removed to expose the top surfaces of the vertical fins 111 before formation of the channel packing layer 180, where the channel packing layer 180 can cover the exposed portions of the vertical fin sidewalls and top surface.

Figure 20:
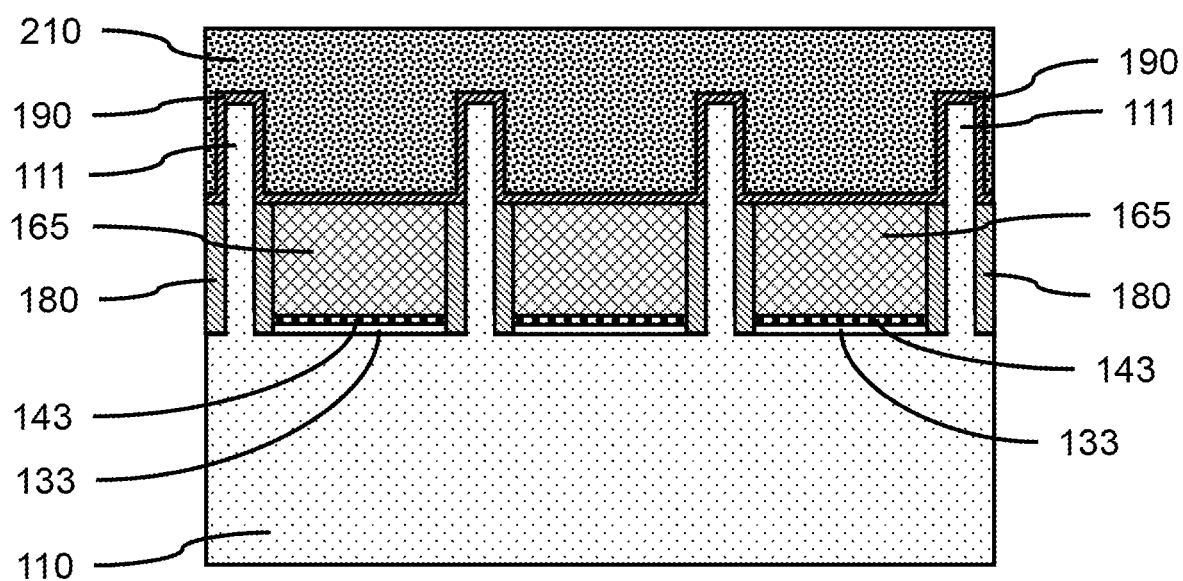
FIG. 20 is a cross-sectional view showing a gate dielectric and conductive gate layer formed on the reduced height channel packing layer and densified fill layer, in accordance with an embodiment of the present invention.

FIG. 20 is a cross-sectional view showing a gate dielectric and conductive gate layer formed on the reduced height channel packing layer and densified fill layer, in accordance with an embodiment of the present invention.

In one or more embodiments, the channel packing layer 180 can be formed in the sidewall channels, and the height of the channel packing layer 180 and densified fill layer 165 can be reduced. The fin templates 120 can be removed to expose the top surfaces of the vertical fins 111 before forming a gate structure. A gate dielectric 190, a work function layer, and conductive gate layer 210 can be formed on the reduced height channel packing layer 180 and densified fill layer 165 across one or more vertical fins.

In other embodiments, the fin templates 120 can be removed before forming the channel packing layer 180, and the channel packing layer 180 can be removed from the reduced height densified fill layer 165 and vertical fin sidewalls before forming the gate dielectric 190, a work function layer, and conductive gate layer 210. A portion of the channel packing layer 180 can remain on a lower portion of the vertical fins 111 between the reduced height densified fill layer 165 and the vertical fin sidewall.

In various embodiments, the gate structure, including the gate dielectric 190, conductive gate layer 210, and optional work function layer 200, can be formed across one or more vertical fins 111, where the gate structure can be formed by a gate first process or replacement gate process.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present principles. The compounds with additional elements will be referred to herein as alloys.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Having described preferred embodiments of a device and method of fabricating the device (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

The invention claimed is:

1. A vertical fin field effect transistor, comprising:
a pair of adjacent vertical fins on a substrate having a trench between the adjacent vertical fins;
a first liner on a base of the trench and a lower portion of each of facing sidewalls of the adjacent vertical fins;
a second liner directly on the first liner comprising a first material on portions of the first liner located on the lower portion of the facing sidewalls;
a third liner comprising a second material directly on portions of the first liner on the base of the trench, wherein the second material is different from the first material;
a fill layer on the second and third liners and between the pair of adjacent vertical fins; and
a gate structure on the fill layer, the first liner, the second liner, and a top portion of each of the adjacent vertical fins.

2. The vertical fin field effect transistor of claim 1, wherein portions of the first and third liners on the base of the trench between the substrate and the fill layer are doped.

3. The vertical fin field effect transistor of claim 1, wherein the fill layer is a flowable oxide having a dielectric constant of less than 3.9.

4. The vertical fin field effect transistor of claim 1, wherein the second material comprises germanium dioxide ($GeO_2$) or amorphous carbon (a-C).

5. The vertical fin field effect transistor of claim 1, wherein the first liner is made of a material selected from the group consisting of silicon oxide (SiO), silicon nitride (SiN), silicon oxynitride (SiON), silicon borocarbonitride (SiBCN), and a combination thereof.

6. The vertical fin field effect transistor of claim 5, wherein the first liner has a thickness in a range of about 3 nm to about 8 nm.

7. The vertical fin field effect transistor of claim 2, wherein the second material comprises germanium oxide, and wherein a dopant in the second material is selected from the group consisting of yttrium (Y), aluminum (Al), scandium (Sc), and combinations thereof.

8. The vertical fin field effect transistor of claim 7, wherein the gate structure comprises a conductive gate layer on at least a portion of a gate dielectric layer.

9. The vertical fin field effect transistor of claim 8, further comprising a work function layer between the conductive gate layer and the gate dielectric layer.

10. A vertical fin field effect transistor, comprising:
a pair of adjacent vertical fins on a substrate having a trench between the adjacent vertical fins;
a first liner on a base of the trench and comprising a first material;
a second liner directly on a lower portion of each of facing sidewalls of the adjacent vertical fins and comprising a second material, wherein the second material is different from the first material;
a fill layer on the first and second liners and between the pair of adjacent vertical fins; and
a gate structure on the fill layer, the second liner, and a top portion of each of the adjacent vertical fins.

11. The vertical fin field effect transistor of claim 10, wherein a portion of the second liner on the base of the trench further comprises a third material.

12. The vertical fin field effect transistor of claim 11, wherein the second and third materials are doped and wherein the second material is selected from the group consisting of germanium dioxide ($GeO_2$) and amorphous carbon (a-C).

13. The vertical fin field effect transistor of claim 10, wherein the gate structure comprises a conductive gate layer on at least a portion of a gate dielectric layer.

14. The vertical fin field effect transistor of claim 13, further comprising a work function layer between the conductive gate layer and the gate dielectric layer.

15. The vertical fin field effect transistor of claim 10, wherein the fill layer has a bulk modulus greater than 20 GPa (>20 GPa), and a hardness greater than 1 GPa.

16. A vertical fin field effect transistor, comprising:
a pair of adjacent vertical fins on a substrate having a trench between the adjacent vertical fins;
a first liner comprising (i) an inner liner section on a lower portion of sidewalls of the adjacent vertical fins and (ii) a doped liner section on a base of the trench;
a second liner directly on the first liner, the second liner comprising a first material on the inner liner section of the first liner;
a third liner comprising a second material directly on the doped liner section of the first liner, wherein the second material is different from the first material;
a fill layer on the second and third liners and between the pair of adjacent vertical fins;
a gate structure comprising a conductive gate layer on at least a portion of a gate dielectric layer on at least a portion of the adjacent vertical fins, the first liner, the second liner, and the fill layer; and
a work function layer between the conductive gate layer and the gate dielectric layer.

17. The vertical fin field effect transistor of claim 16, wherein the second material is selected from a group consisting of germanium dioxide ($GeO_2$) and amorphous carbon (a-C).

18. The vertical fin field effect transistor of claim 17, wherein a dopant in the second material is selected from a group consisting of yttrium (Y), aluminum (Al), scandium (Sc), and combinations thereof.

19. The vertical fin field effect transistor of claim 18, wherein the fill layer has a bulk modulus greater than 8 gigapascals (>8 GPa).

* * * * *